United States Patent [19]
Bosscha

[11] Patent Number: 5,144,218
[45] Date of Patent: Sep. 1, 1992

[54] DEVICE FOR DETERMINING THE CHARGE CONDITION OF A BATTERY

[75] Inventor: Geert J. Bosscha, Drachten, Netherlands

[73] Assignee: U.S. Philips Corporation, New York, N.Y.

[21] Appl. No.: 613,347

[22] Filed: Nov. 13, 1990

Related U.S. Application Data

[63] Continuation-in-part of Ser. No. 516,652, Apr. 30, 1990, abandoned.

[30] Foreign Application Priority Data

Oct. 25, 1989 [NL] Netherlands ............... 8902639

[51] Int. Cl.$^5$ .................................................. H02J 7/04
[52] U.S. Cl. .............................................. 320/44; 320/48
[58] Field of Search ....................... 320/43, 44, 48

[56] References Cited

U.S. PATENT DOCUMENTS

| | | | |
|---|---|---|---|
| 4,194,146 | 3/1980 | Patry et al. | 320/44 |
| 4,307,330 | 12/1981 | Belot | 320/44 |
| 4,677,363 | 6/1987 | Kopmann | 320/44 |
| 4,743,831 | 5/1988 | Young | 320/38 X |
| 4,775,827 | 10/1988 | Ijntema et al. | 320/44 |
| 5,043,651 | 8/1991 | Tamura | 320/44 X |

Primary Examiner—R. J. Hickey
Attorney, Agent, or Firm—Bernard Franzblau

[57] ABSTRACT

A device for determining the charge condition of a battery (10) comprises a current-frequency converter (50) which generates pulses of a frequency is dependent on the battery charge or discharge current. These pulses are counted and are used for computing the battery charge condition. In order to indicate a correct relative charge condition, especially in the case of a battery capacity which has changed due to, for example, ageing, the device comprises detection means (53) which detects an actual battery charge condition and correction means (52) for correcting the charge condition computed by a computing means (51). In one embodiment the correction means are integrated with the current-frequency converter and the frequency of the generated pulses is adapted to the present capacity of the battery.

20 Claims, 5 Drawing Sheets

DEVICE FOR DETERMINING THE CHARGE CONDITION OF A BATTERY

This is a continuation-in-part of application Ser. No. 516,652, filed Apr. 30, 1990, now abandoned.

BACKGROUND OF THE INVENTION

This invention relates to a device for determining the charge condition of a battery, which device comprises:

a current-frequency converter for generating pulses at a frequency which is dependent on a current flowing through the battery;

computing means for determining a computed charge condition of the battery on the basis of the generated pulses; and indicator means for indicating the computed charge condition as a fraction of the capacity of the battery. Such a device can be used in appliances fed by rechargeable batteries and is particularly suitable for use in a rechargeable electric shaver.

A device as described in the opening paragraph is known from DE-A No. 23 13 566. During charging and discharging of the battery the charge and discharge currents in this device are measured by means of a resistor which is arranged in series with the battery. The voltage across this resistor is amplified and subsequently integrated, with the amplification as well as the integration constant upon discharging being different from those upon charging of the battery. The integrated voltage is compared with a reference voltage and whenever this reference voltage is reached, a pulse is generated and the integrated voltage is reset again. These pulses are counted in a counter whose count is made visible by means of an indicator indicating the charge condition of the battery. While the battery is being discharged, a warning signal is given when a given count is reached and the load is decoupled after a certain time to prevent complete discharge of the battery. While the battery is being charged, the charge circuit is switched off when a maximum count is reached so as to avoid overcharging of the battery.

In the known device a modification of the capacity of the battery in the indicated charge condition is processed by measuring the external condition which causes the modification, for example, the temperature, and by adding extra pulses to or subtracting extra pulses from the count for this purpose.

This method leads to reasonable results if the capacity of the battery is substantially constant and if it only depends on one or at most several external conditions which can be subjected to parametrization. Consequently, the device is less suitable for use in a rechargeable electric apparatus in which nickel-cadmium (NC) batteries are used such as, for example an electric shaver. The capacity of such batteries is in fact not only dependent on the temperature but also on parameters such as age and history of use. For example, the capacity of an NC battery quickly decreases if the battery is not regularly charged and discharged completely. A condition such as the history of use can hardly be subjected to parametrization.

SUMMARY OF THE INVENTION

It is therefore one of the objects of the invention to provide a device in which an accurate indication of the relative charge condition of the battery can be obtained without having to determine the variation of external and internal parameters. According to the invention this device is characterized in that it further comprises:

detection means for detecting at least one actual charge condition of the battery when it is being charged or discharged; and correction means for correcting the computed charge condition when the detected actual charge condition deviates from the computed charge condition, said correction means being adapted to modify the number of pulses corresponding to a variation of the absolute or relative charge condition of the battery.

The actual charge condition is measured at least once by means of the detection means during charging or discharging of the battery. For example it may indicate that the battery is completely charged, which is detected by a then occurring temperature increase. During discharging a threshold voltage may also be detected which is associated with a condition in which the battery is discharged to a certain level. If the number of counted pulses originating from the current-frequency converter does not correspond to the then occurring detected charge condition, the modified battery capacity is processed in the indicated charge condition by means of the correction means. The correction means may be adapted to modify the number of pulses corresponding to an absolute variation of the charge, as well as the number of pulses corresponding to a modification of the relative charge condition.

It is to be noted that it is known per se from EP-A No. 0,248,461 which corresponds to U.S. Pat. No. 4,775,827 (Oct. 4, 1988) to correct the indicated charge condition by detecting the actual charge condition during charging or discharging. However, in this known device the period which is required to charge or discharge the battery completely is determined by means of a time measurement. Subsequently, the time elapsed during charging or discharging is used to make an estimate of the charge condition. Thus, in the known device it is not the actual charge withdrawn from the battery which is measured, but the time during which charge is withdrawn from the battery. The method by which this device works thus only gives a reasonably accurate indication of the charge condition when the discharge current during each discharge cycle has approximately the same behaviour.

EP-A No. 0,012,315 which corresponds to U.S. Pat. No. 4,307,330 (Dec. 22, 1981) describes a device comprising a current-frequency converter for generating pulses at a frequency which is dependent on a current flowing through the battery, computing means for determining a computed charge condition of the battery on the basis of the generated pulses, and correction means, but this device does not comprise detection means for detecting at least one actual charge condition of the battery when it is being charged or discharged, and the correction means do not correct the computed charge condition when the detected actual charge condition deviates from the computed charge condition, but they correct the value of a charge current on the basis of the computed charge condition of the battery in order to improve the efficiency of charging the battery.

A first embodiment of the device according to the invention is characterized in that the correction means are adapted to modify the ratio between the number of pulses and a variation of the computed relative charge condition. By varying the number of pulses corresponding to the capacity of the battery in the computing means, a correction of the indicated charge condition is achieved. The quantity of charge for each generated pulse remains the same. This solution can be easily realised by means of a programmed microprocessor.

A second embodiment of the device according to the invention is characterized in that the correction means are adapted to modify the frequency of the pulses generated in the current-frequency converter. According to this embodiment the number of pulses corresponding to a given percentage of the battery capacity remains constant, but the quantity of charge withdrawn from the battery per generated pulse is varied. This embodiment can be very easily integrated with the current-frequency converter and can also be easily combined with a correction circuit which is provided to take into account the more than proportional discharge occurring at larger discharge currents.

An embodiment of the device according to the invention, in which the current-frequency converter comprises a measuring resistor arrranged in series with the battery and a voltage-controlled oscillator whose input terminals are coupled to the terminals of the measuring resistor, is further characterized in that the voltage-controlled oscillator has a control input for adapting the frequency of the generated pulses as a function of a signal presented to the control input. This embodiment, in which the voltage-controlled oscillator comprises an operational amplifier, is further characterized in that said control input is a control input of the operational amplifier. The amplification by the operational amplifier of the voltage which is present across the measuring resistor is influenced by a signal which is generated by the detection means.

An embodiment in which the frequency of the generated pulses is influenced in a different way is characterized in that the voltage-controlled oscillator comprises a capacitor and a comparator, an input of said comparator being coupled to a terminal of the capacitor and another input being coupled to a reference voltage source, while the voltage generated by the reference voltage source is adjustable via the control input of the current-frequency converter. This can also be realised by means of a circuit which is characterized in that the voltage-controlled oscillator comprises a capacitor and a comparator arranged parallel to the capacitor, an input of said comparator being coupled to a reference voltage source and another input being coupled to a terminal of the capacitor via a voltage divider which is adjustable via the control input of the current-frequency converter. In these two embodiments it is not the amplification factor of the operational amplifier which is modified, but the voltage across the capacitor at which a pulse is generated and hence the integration time for the current through the measuring resistor.

In addition to the indicator means for indicating the relative charge condition indicating the battery charge as a percentage of the capacity, the device according to the invention may be further provided with an indicator for indicating at least one absolute charge condition. This is important for, for example, a rechargeable electric shaver in which an indication is given that the battery has almost run out. To prevent untimely run-out of the battery, this indication must be given at a moment when the battery charge is still sufficient for at least one shave.

To this end the device according to the invention for determining the charge condition of the battery is further characterized in that the device comprises further computing means for computing the absolute charge condition to be indicated from the computed relative charge condition and the adjustment of the correction means. In this way the absolute charge condition is computed from the relative charge condition and the charge which corresponds to a generated pulse.

The information about the charge condition of the battery is very well usable when charging the battery. To this end an embodiment of the device according to the invention is further characterized in that the device further comprises a charge circuit for charging the battery with a charge current whose power undergoes an at least stepwise adaptation based on the computed and corrected relative charge condition of the battery. By adapting the charge current to the charge condition of the battery, for example, overcharging can be avoided. A further embodiment of the device according to the invention is characterized in that the adaptation varies in accordance with a predetermined characteristic curve which is typical of the battery and which indicates the relationship between a charge current having a maximal charge acceptance by the battery and the charge condition of the battery. The battery is now constantly charged with the largest possible current which the battery can process. Such a charge regime is very suitable for quick charging of the battery.

BRIEF DESCRIPTION OF THE DRAWING

These and other more detailed aspects of the invention will now be described in greater detail by way of example, with reference to the accompanying drawings in which.

DESCRIPTION OF THE PREFERRED EMBODIMENTS

Figure 1:
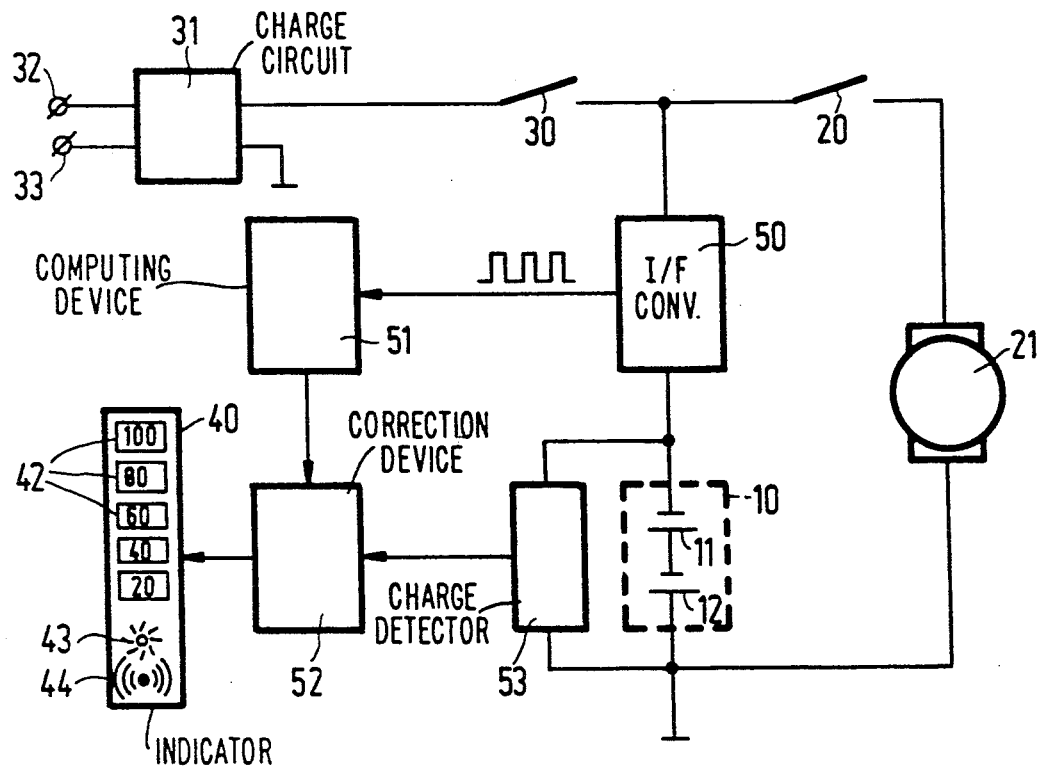
FIG. 1 shows diagrammatically a first embodiment of a device according to the invention.

FIG. 1 shows a rechargeable battery 10 comprising, for example, two accumulator cells 11 and 12. The battery can be connected by means of a switch 20 to a load 21, for example, the motor of an electric shaver for driving this motor. The battery can be connected via another switch 30 to a charge circuit 31 for charging the battery. The charge circuit may be fed with the required energy, for example, from the ac supply voltage via two connection terminals 32 and 33. Such charge circuits are known to those skilled in the art and may be, for example, switched-mode or self-oscillating power supplies.

To provide the user with information about the charge condition of the battery 10, a charge indicator 40 is provided comprising, for example, a number of elements 42 indicating the charge condition as a fraction of the battery capacity. In the Figure the charge is indicated in units of 20%. The charge indicator 40 may also emit an optical signal 43 and/or an acoustical signal 44 so as to indicate that the battery has an amount of energy which will only last for a short time, which is, for example, sufficient to feed the apparatus with energy for a limited number of minutes.

To determine the charge condition of the battery a current-frequency converter 50 is provided which generates pulses, dependent on the current flowing through the current-frequency converter. This is also the discharge or charge current of the battery. Each pulse generated by the current-frequency converter corresponds to a given quantity of charge which is withdrawn from the battery or which is applied to the battery. The generated pulses are counted in computing means 51 and the relative and/or absolute charge condition of the battery is computed from the total number of pulses and the nominal capacity.

This method provides a sufficiently accurate indication of the charge condition of the battery if the actual capacity of the battery corresponds to the nominal capacity stored in the computing means. However, the capacity of a rechargeable nickel-cadmium battery decreases with an increasing age of the battery and may also be considerably influenced by the way in which the battery is treated. For example, a nickel-cadmium battery becomes partly inert if it is not regularly charged and discharged completely. Such a treatment leads to a faster decrease of the capacity.

To take the actual capacity of the battery into account when computing the charge condition, the device comprises detection means 53 for detecting an actual charge condition. The detection means 53 detect, for example, the battery voltage which corresponds to a battery which has been discharged by, for example 80%. The charge condition determined by means of the computing means is compared therewith. If this computed charge condition deviates from the detected actual charge condition, the computed charge condition is corrected via the correction means 52. In the device shown in FIG. 1 this correction consists of varying the nominal capacity expressed in the number of pulses which corresponds to the total charge capacity of the battery. Moreoever, the number of pulses corresponding to a fraction indicated by one of the blocks 42 is modified proportionally, as well as the count at which the optical signal 43 and/or the acoustical signal 44 is activated. The latter count is preferably modified in such a way that the residual charge in the battery remains equal when these signals are activated, so that after activation the apparatus can be used for the same fixed period, for example, three minutes. The computing means 51 and the correction means 52 are realised, for example, by means of a programmed microprocessor.

The detection means 53 comprise, for example, a comparator which compares the battery voltage with a reference voltage derived therefrom. It is to be noted that such detection means are known per se, for example, from U.S. Pat. No. 4,563,757 and from EP-A 0,115,625 which corresponds to U.S. Pat. No. 4,567,476 Jan. 28, 1986. The actual charge condition can also be measured in another manner known to those skilled in the art, for example, by measuring the variation of the battery voltage with time instead of the battery voltage itself. In fact, the battery voltage decreases rapidly in an NC battery which has substantially run down.

While the battery is being charged, the actual charge condition of the battery and hence the battery capacity can be determined with reference to parameters such as temperature of the battery, pressure within the battery and, for an NC battery, an increasing battery voltage and a subsequently decreasing battery voltage in the case of continued charging. In addition to one single detection of the actual charge condition, for example, at 80% discharge or at almost complete charge, the detection means 53 may also activate the correction means 52 in the case of a larger number of actual charge conditions. In that case, however, the required circuit becomes more complicated and hence more expensive.

If desired, the circuit may be further provided with control means (not shown) with which the switches 30 and 20 can be opened if there is a risk that the battery is completely discharged or overcharged.

Figure 2:
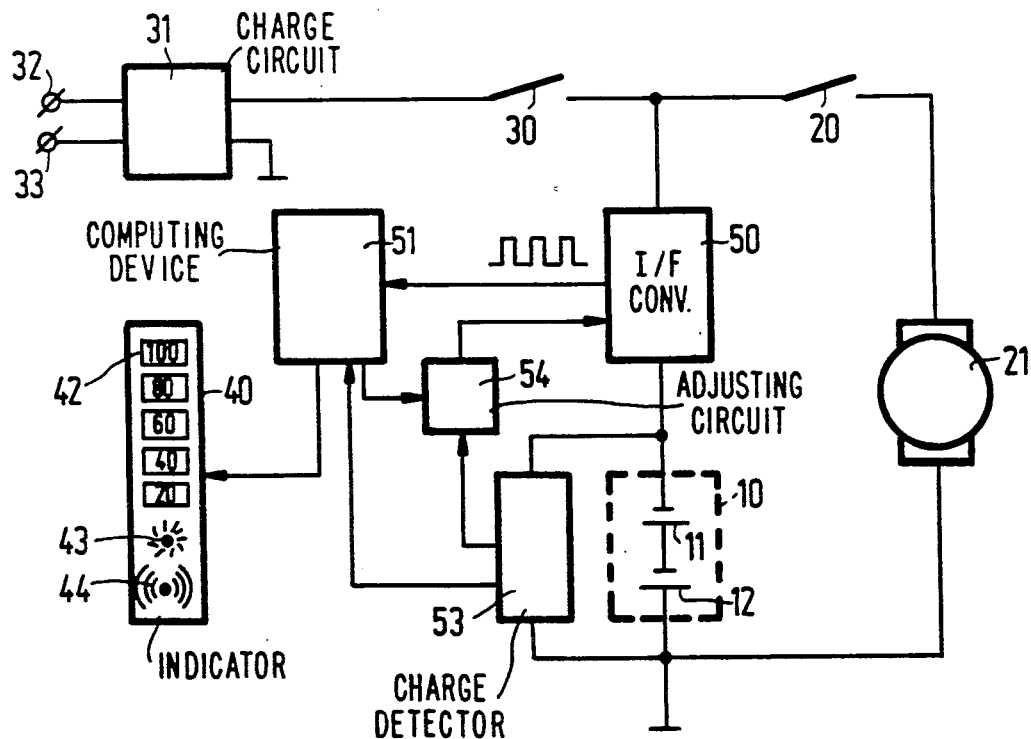
FIG. 2 also shows diagrammatically, a second embodiment.

FIG. 2 diagrammatically shows another embodiment of the device according to the invention. In this Figure comparable elements are denoted by the same reference numerals as in FIG. 1. In this embodiment the computed charge condition is not adapted to the actual charge condition by correcting the number of pulses which corresponds to a variation of the charge, but by modifying the quantity of charge withdrawn from the battery and corresponding to one pulse. To this end the correction means now comprises an adjusting circuit 54 coupled to the computing means 51 and the detection means 53 and with which the current-frequency converter 50 is controlled so that the frequency can be modified if it appears that the computed charge condition and the actual charge condition do not correspond. The number of pulses corresponding to a relative charge condition remains the same by means of this circuit. To give an absolute indication of the charge condition, for example, of a threshold value at which the visual or acoustical signals 43 and 44 are activated, it is necessary to adapt the relevant limit values expressed in a number of pulses in the computing means 51. The adjusting circuit 54 may also adapt the frequency if there is a more than proportional discharge rate, for example, due to a large discharge current.

Figure 3:
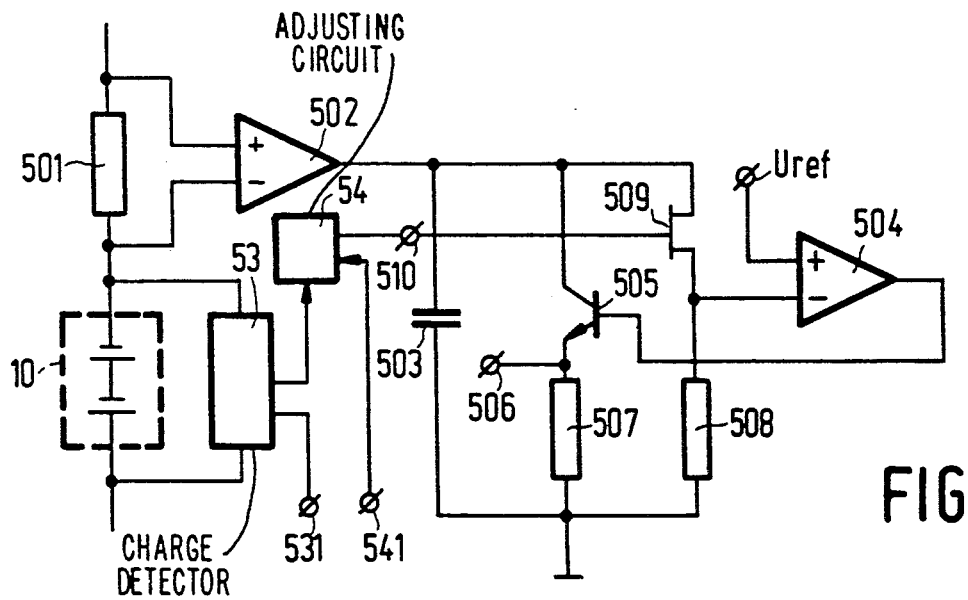
FIG. 3 shows a first elaboration of a current-frequency converter for use in the embodiment according to FIG. 2.

FIG. 3 shows an embodiment of a current-frequency converter which can be used in the device according to the invention. This Figure only shows the current-frequency converter and the elements directly coupled thereto. In this embodiment and the following embodiments the correction means are integrated in the current-frequency converter.

The current-frequency converter comprises a resistor 501 which is arranged in series with the battery 10. If the battery supplies current or is charged, there is a voltage drop across the resistor 501. This voltage drop is converted by a voltage-controlled oscillator into a series of pulses whose frequency depends on the voltage across the resistor. To this end the two inputs of an operational amplifier 502 are arranged parallel to the resistor 501, while the output of the amplifier supplies a current which is proportional to the voltage difference at the inputs and hence to the current flowing through the battery. A capacitor 503 is charged by means of the output current of the operational amplifier 502. The series arrangement of a switch 505, for example, a transistor and a resistor 507 is arranged parallel to this capacitor. The voltage across the capacitor 503 is compared with a reference voltage $U_{ref}$ by means of a comparator 504. The capacitor voltage is presented to the capacitor via a voltage divider comprising an element 509 having an adjustable impedance, for example, a FET, and a resistor 508. The output of the comparator 504 is coupled to the control input of the switch 505 so that the open or closed state of this switch is dependent on the voltages at the inputs of the comparator.

As soon as the capacitor 503 is charged to a voltage level such that the voltage at the output of the voltage divider exceeds the reference voltage $U_{ref}$, the comparator switches over and the switch 505 is closed. The capacitor 503 is then discharged via the resistor 507 and a voltage pulse is simultaneously generated at the output 506 of the current-frequency converter.

The threshold level at which the comparator 504 switches over is dependent on the adjustment of the element 509 having a variable impedance. This adjustment is controlled via the adjusting circuit 54 and the control input 510 of the current-frequency converter. By also causing the impedance of the element 509 to decrease with a decreasing battery capacity, the relative quantity of charge corresponding to each pulse generated at the output 506 as a fraction of the battery capacity remains constant. The adjusting circuit 54 is connected to the computing means 51 via an input 541. The detection means 53 have a second output 531 with which a signal is applied to the computing means 51 for determining the absolute charge condition.

Figure 4:
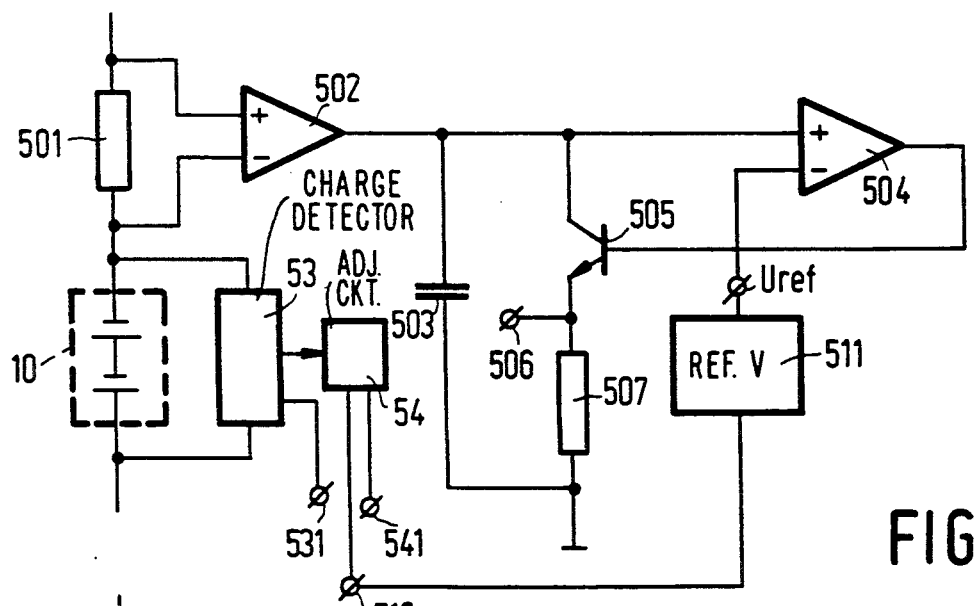
FIG. 4 shows a second elaboration of a current-frequency converter which can be used in accordance with the invention.

Instead of using a variable voltage divider, the value of the reference voltage $U_{ref}$ can alternatively be varied so as to adapt the threshold level at which the capacitor is discharged to the modified battery capacity. Such a current-frequency converter is shown in FIG. 4.

This Figure is largely identical to FIG. 3 and therefore the identical parts will not be described. The current-frequency converter according to FIG. 4 comprises an adjustable reference voltage source 511 which generates the reference voltage $U_{ref}$ with which the voltage across the capacitor 503 is compared. The adjustment of the reference voltage source 511 is controlled from the computing means 51, the detection means 53 and the adjusting circuit 54 via the control input 510 of the current-frequency converter.

Figure 5:
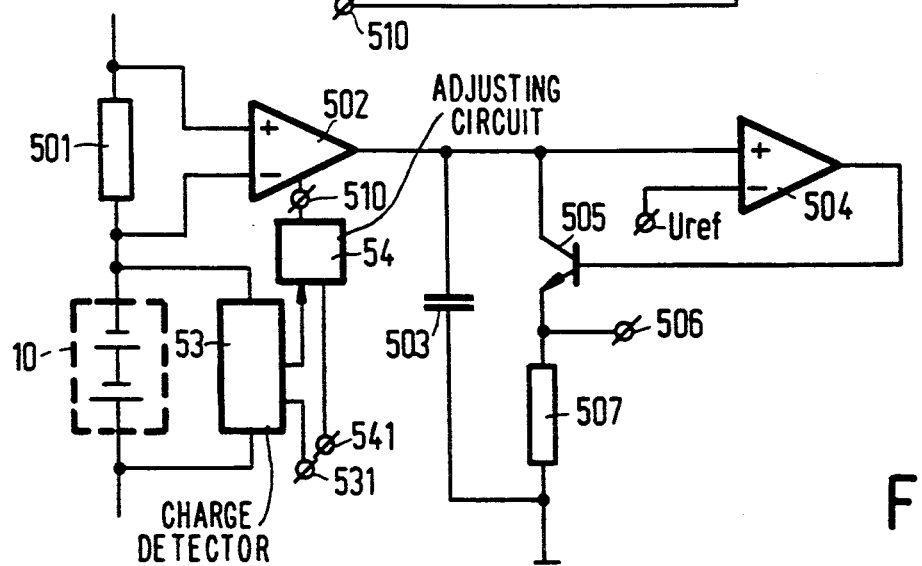
FIG. 5 shows a third embodiment of a current-frequency converter which can be used.

FIG. 5 shows another embodiment. This Figure is also largely identical to FIGS. 3 and 4 and only the differences will hereinafter be described. The circuit according to FIG. 5 comprises an operational amplifier 502 whose amplification factor and hence the output current is adjustable so that the rate at which the capacitor 503 is charged is not only dependent on the voltage drop across the resistor 501 but also on the signal applied to the control input of the operational amplifier 502. This control input is coupled to the output of the adjusting circuit 54 via the input 510 of the current-frequency converter. The adjusting circuit is in turn connected to the computing means 51 and the detection means 53.

Figure 6:
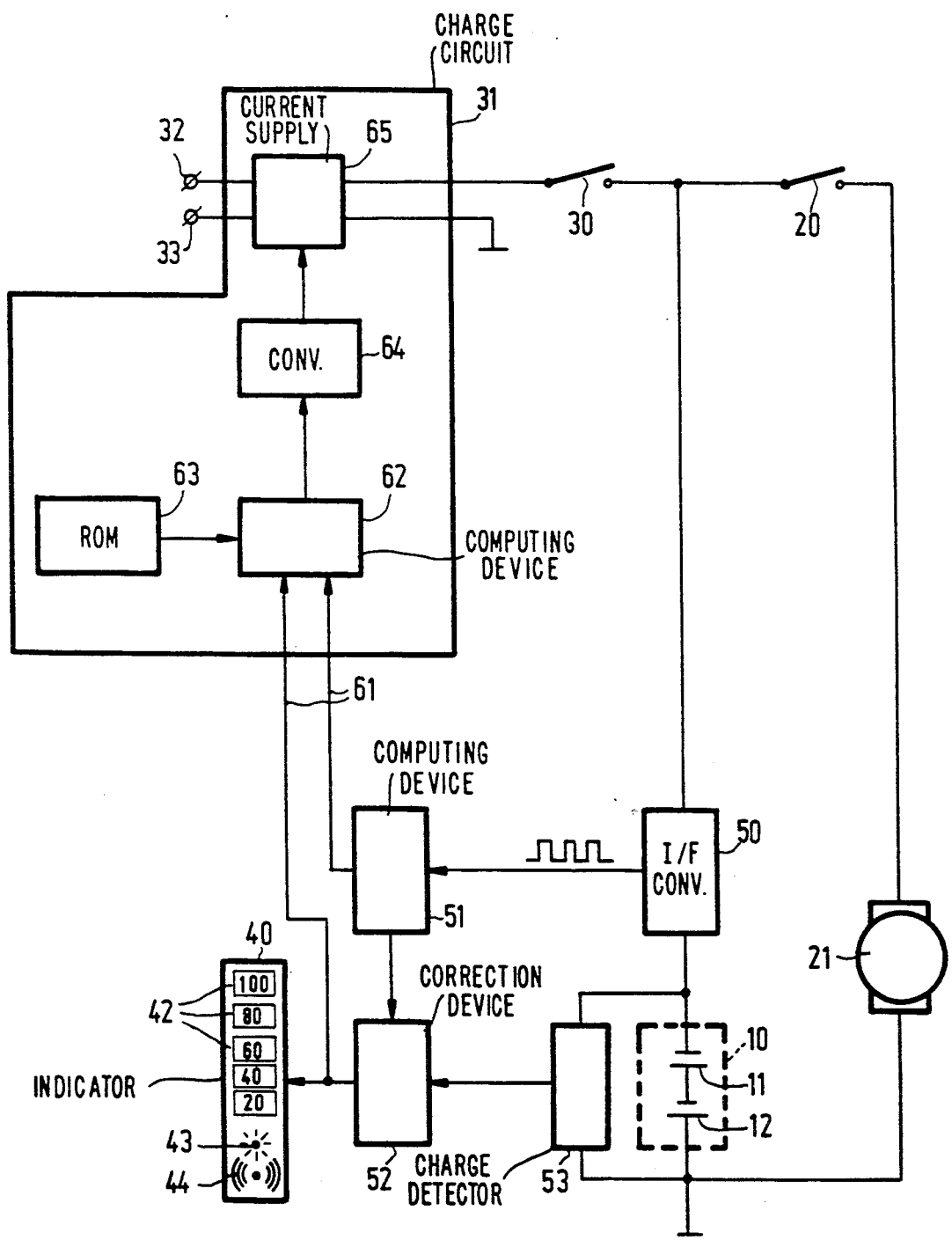
FIGS. 6 and 7 show embodiments of devices according to the invention comprising a controlled charge circuit.

FIG. 6 shows an embodiment of the device which largely corresponds to that of FIG. 1 and in which corresponding elements are denoted by the same reference numerals. The charge circuit 31 now has a control input 61 which is coupled to outputs of the computing means 51 and the correction means 52. The information at control input 61 is translated in a computing member 62 with reference to a table stored in a Read Only Memory (ROM) 63 into signals which are converted by a converter 64 into a suitable control signal for a controllable supply source 65 which supplies a charge current to the battery 10 via the switch 30. The information at control input 61 indicates the computed and corrected charge condition of the battery and the current supplied by the charge circuit is now dependent on this information. The relation between this information and the current to be supplied is stored in a tabular form in ROM 63. The table may comprise as many values as there are elements 42 in the charge indicator 40. Alternatively, there may be more of fewer values. Whenever the information at control inputs 61 changes, the computing member 62 computes a new signal with reference to the values in ROM 63, which signal is applied to the controlled supply source 65 via converter 64. In this way it is possible to adapt the charge current supplied by the supply source 65 to the actual charge condition of the battery 10.

Figure 7:
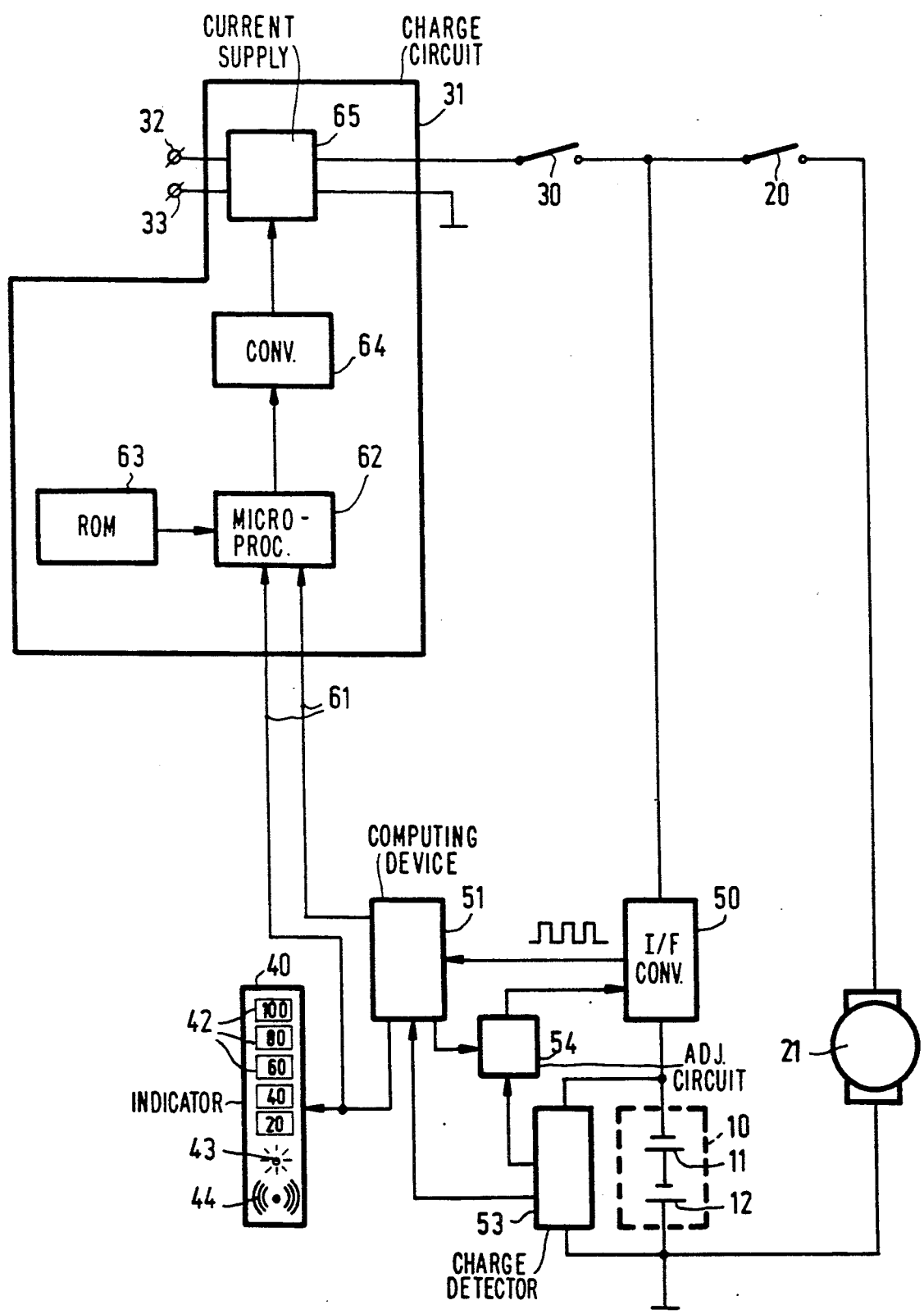

FIG. 7 shows an embodiment of the device comprising a charge circuit which is similar to that shown in FIG. 6, but which is used in the embodiment shown in FIG. 2. The reference numerals denote identical elements in FIGS. 2 and 6, and the operation of the charge circuit is the same as to that of FIG. 6.

The computing member can be realised by means of a programmed microprocessor. The controllable supply source 65 and converter 64 may be combined in a programmable supply source. The number of steps with which the charge current supplied by the supply source 65 can be adjusted need not be equal to the number of steps by which the charge indicator 40 can indicate the charge condition of the battery 10. It is, for example, possible to compute the charge condition in steps of 10% and to store ten values in ROM 63 for computing the associated charge current.

Figure 8:
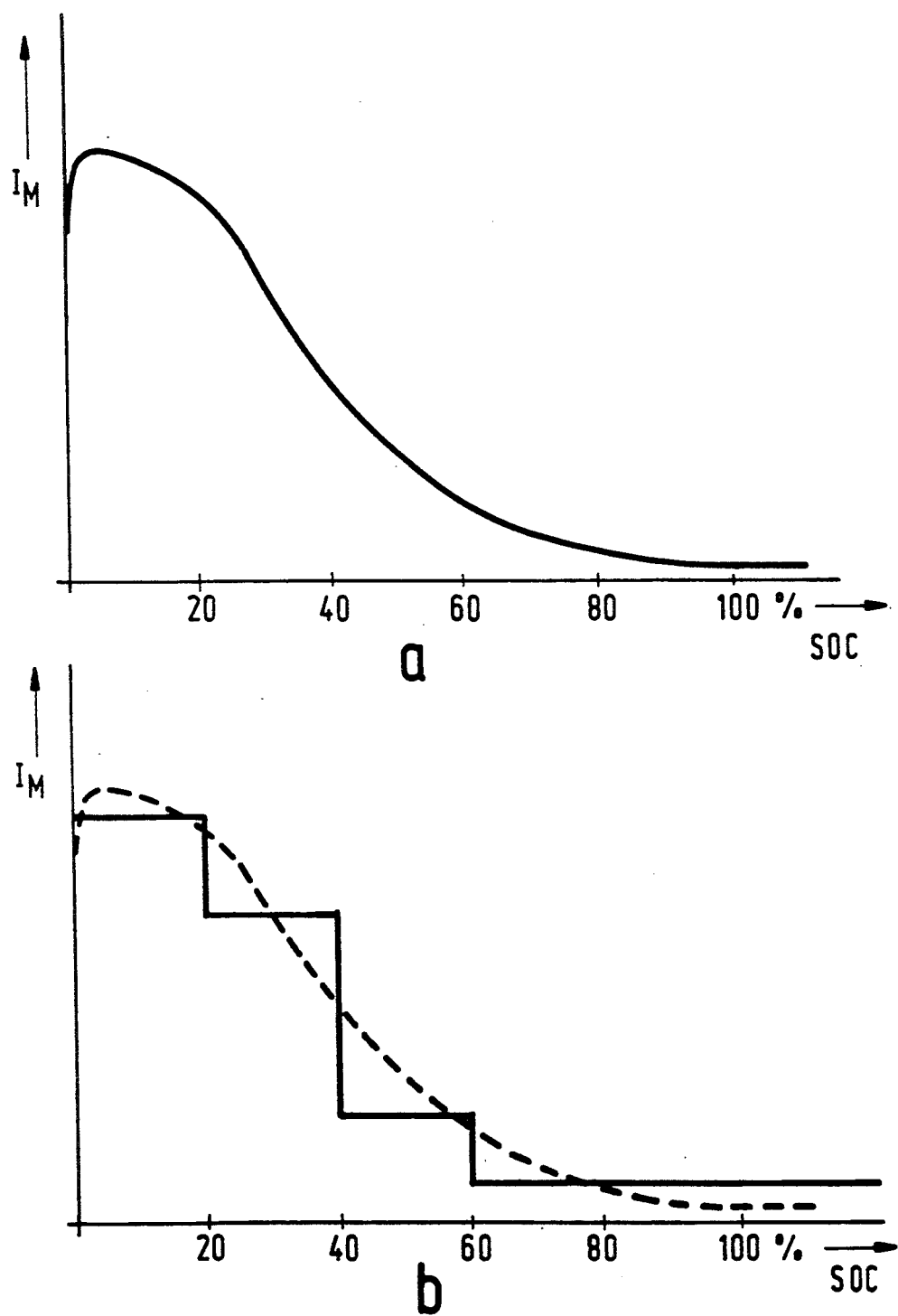
FIG. 8a and b shows charge characteristics of a rechargeable battery.

The table stored in ROM 63 actually determines the charge regime of the battery. A plurality of charge regimes, which are divided or not divided into a different number of steps, may be stored. A very interesting charge regime is shown in the graph of FIG. 8a. In this graph the current $I_M$ which corresponds to the maximal charge acceptance by a battery, in this case an NC battery, is plotted versus the relative state of charge SOC of the battery. This relationship is determined experimentally and is characteristic of the type of battery. A battery can be recharged very quickly by means of a charge current which varies in accordance with the characteristic curve shown without any risk of gas developing in the battery or other unwanted side effects. In FIG. 8b the characteristic curve of this quick-charge regime is approximated in four steps which fit in with the 20% steps of the charge indicator 40. Four steps of this charge regime are then also stored in the ROM 63, but a more refined approximation with more than four steps and as many values in the ROM 63 is alternatively possible.

I claim:

1. A device for determining the charge condition of a battery comprising:

a current-frequency converter, including means for sensing a current flow through the battery, for generating pulses at a frequency which is dependent on the current flowing through the battery;

computing means for determining a computed relative charge condition of the battery by counting the number of converter pulses generated; and indicator means for indicating the computed charge condition as a fraction of the capacity of the battery, detection means for detecting at least one actual relative charge condition of the battery when it is being charged or discharged; and correction means, including means for comparing the actual relative charge condition with the computed relative charge condition, for adjusting the computed relative charge condition when the detected actual relative charge condition deviates from the computed relative charge condition, said correction means being adapted to modify the number of pulses needed to represent a predetermined variation of the computed relative charge condition of the battery.

2. A device for determining the charge condition of a battery as claimed in claim 1, wherein the correction means are adapted to modify the predetermined variation so that the same number of pulses represents a different variation in the computed relative charge condition.

3. A device for determining the charge condition of a battery as claimed in claim 1, wherein the correction means modify the frequency of the pulses generated in the current-frequency converter.

4. A device for determining the charge condition of a battery as claimed in claim 1 wherein the current-frequency converter comprises a measuring resistor (501) arranged in series with the battery (10) and a voltage-controlled oscillator whose input terminals are coupled to terminals of the measuring resistor, wherein the voltage-controlled oscillator has a control input for adapting the frequency of the generated pulses as a function of a signal presented to said control input.

5. A device for determining the charge condition of a battery as claimed in claim 4, wherein the voltage-controlled oscillator comprises an operational amplifier and said operational amplifier comprises a gain control input for controlling the amplifier gain, the gain control input being connected to said control input.

6. A device for determining the charge condition of a battery as claimed in claim 4, wherein the voltage-controlled oscillator comprises a capacitor and a comparator, an input of said comparator being coupled to a terminal of the capacitor and another input being coupled to a reference voltage source, a voltage generated by the reference voltage source being adjustable via the control input of the voltage-controlled oscillator.

7. A device for determining the charge condition of a battery (10) as claimed in claim 4, wherein the voltage-controlled oscillator comprises a capacitor and a comparator coupled having an input coupled to a reference voltage source and another input coupled to a terminal of the capacitor via a voltage divider which is adjustable via the control input of the voltage controlled oscillator.

8. A device for determining the charge condition of a battery as claimed in claim 4, wherein the device also includes an indicator for indicating at least one absolute charge condition, and the computing means computes the at least one absolute charge condition from the computed relative charge condition and the adjustment of the correction means.

9. A device for determining the charge condition of a battery as claimed in claim 1, which further comprises a charge circuit for charging the battery with a charge current whose power undergoes an at least stepwise adaptation based on the computed and corrected relative charge condition of the battery.

10. A device for determining the charge condition of a battery as claimed in claim 9, wherein the adaptation varies in accordance with a predetermined characteristic curve which is typical of the battery and which indicates the relationship between a charge current having a maximal charge acceptance by the battery and the charge condition of the battery.

11. A shaver comprising: a rechargeable battery, a motor coupled to said battery via a switch, and a device as described in claim 1 coupled to the battery for determining the charge condition of the battery.

12. A device for determining the charge condition of a battery as claimed in claim 1, wherein the device also includes an indicator for indicating at least one absolute charge condition and the computing means computes the at least one absolute charge condition from the computed relative charge condition and the adjustment of the correction means.

13. A device for determining the charge condition of a battery as claimed in claim 2, wherein the device also includes an indicator for indicating at least one absolute charge condition and the computing means computes the at least one absolute charge condition from the computed relative charge condition and the adjustment of the correction means.

14. A device for determining the charge condition of a battery as claimed in claim 3, wherein the device also includes an indicator for indicating at least one absolute charge condition and the computing means computes the at least one absolute charge condition from the computed relative charge condition and the adjustment of the correction means.

15. A device for determining the charge condition of a battery as claimed in claim 2, which further comprises a charge circuit for charging the battery with a charge current which undergoes an at least stepwise adaptation based on the computed and corrected relative charge condition of the battery.

16. A device for determining the charge condition of a battery as claimed in claim 3, which further comprises a charge circuit for charging the battery with a charge current which undergoes an at least stepwise adaptation based on the computed and corrected relative charge condition of the battery.

17. A device for determining the charge condition of a battery as claimed in claim 7, which further comprises a charge circuit for charging the battery with a charge current which undergoes an at least stepwise adaptation based on the computed and corrected relative charge condition of the battery.

18. A device for determining the charge condition of a battery as claimed in claim 1, wherein the current-frequency converter comprises a voltage controlled oscillator having a control input for controlling the frequency of the generated pulses as a function of a signal at said control input, said voltage controlled oscillator comprising;
    an operational amplifier responsive to battery current and having a gain control input connected to said control input of the voltage controlled oscillator,
    a capacitor coupled to an output of the operational amplifier,
    a comparator having first and second inputs coupled to a source of reference voltage and to said capacitor, respectively, and
    a switching transistor coupled to the capacitor and having a control electrode coupled to an output of the comparator.

19. A device for determining the charge condition of a battery as claimed in claim 1 wherein said correction means are controlled by output signals from the computing means and the detection means, and the current-frequency converter comprises a voltage controlled oscillator having a control input for controlling the frequency of the generated pulses as a function of a signal at said control input, and means coupling said voltage controlled oscillator control input to an output of the correction means.

20. A device for determining the charge condition of a battery as claimed in claim 19 wherein said voltage controlled oscillator further comprises;

an operational amplifier responsive to battery current and having an output, a capacitor coupled to the output of the operational amplifier, an adjustable voltage divider coupled to said capacitor and having a control electrode coupled to the control input of the voltage controlled oscillator, and a comparator having first and second inputs coupled to a source of reference voltage and to said voltage divider, respectively, and a switching transistor coupled to the capacitor and having a control electrode coupled to an output of the comparator.

* * * * *